United States Patent
Husth (10) Patent No.: US 11,657,642 B2
(45) Date of Patent: May 23, 2023

(54) SENSOR DISPLACEMENT COMPENSATION IN AN OPTICAL BIOMETRIC IMAGING ARRANGEMENT UNDER A DISPLAY

(71) Applicant: FINGERPRINT CARDS ANACATUM IP AB, Gothenburg (SE)

(72) Inventor: Arne Husth, Hellerup (DK)

(73) Assignee: FINGERPRINT CARDS ANACATUM IP AB, Gothenburg (SE)

( * ) Notice: Subject to any disclaimer, the term of this patent is extended or adjusted under 35 U.S.C. 154(b) by 0 days.

(21) Appl. No.: 17/620,176

(22) PCT Filed: Jun. 24, 2020

(86) PCT No.: PCT/SE2020/050658
§ 371 (c)(1),
(2) Date: Dec. 17, 2021

(87) PCT Pub. No.: WO2021/002791
PCT Pub. Date: Jan. 7, 2021

(65) Prior Publication Data
US 2022/0343670 A1 Oct. 27, 2022

(30) Foreign Application Priority Data
Jul. 3, 2019 (SE) .................................... 1950837-3

(51) Int. Cl.
*G06V 40/13* (2022.01)
*G06V 10/14* (2022.01)
(Continued)

(52) U.S. Cl.
CPC .......... *G06V 40/1318* (2022.01); *G06V 10/14* (2022.01); *G06V 10/24* (2022.01);
(Continued)

(58) Field of Classification Search
None
See application file for complete search history.

(56) References Cited

U.S. PATENT DOCUMENTS

| 8,811,769 B1 | 8/2014 | Pitts et al. |
| 2007/0058844 A1 | 3/2007 | Fenrich |

(Continued)

FOREIGN PATENT DOCUMENTS

EP 3182697 A1 6/2017

OTHER PUBLICATIONS

International Search Report and Written Opinion for International Application No. PCT/SE2020/050658 dated Oct. 7, 2020 (11 pages).

*Primary Examiner* — Joseph R Haley
(74) *Attorney, Agent, or Firm* — RMCK Law Group, PLC (57) ABSTRACT

The present invention relates to a method for producing a biometric image using an optical biometric imaging arrangement including a set of micro lenses adapted to redirect incoming light onto a photodetector pixel array, the method comprising: capturing a biometric image including a set of sub-images using an optical biometric imaging device; estimating a spatial transformation between the at least one biometric sub-image and corresponding masking calibration sub-images; applying the spatial transformation to retrieved illuminance calibration sub-images adapted for illuminance calibration for captured biometric sub-images to align the illuminance calibration sub-images with the biometric image; and normalizing the biometric sub-images using the aligned calibration sub-images for providing a normalized biometric image based on the normalized biometric sub-images.

20 Claims, 8 Drawing Sheets

(51) Int. Cl.
*G06V 40/12* (2022.01)
*G06V 10/24* (2022.01)
H01L 27/146 (2006.01)
G06F 3/041 (2006.01)

(52) U.S. Cl.
CPC ...... *G06V 40/1324* (2022.01); *G06V 40/1335* (2022.01); *G06V 40/1365* (2022.01); G06F 3/0418 (2013.01); H01L 27/14623 (2013.01); H01L 27/14627 (2013.01); H01L 27/14678 (2013.01)

(56) References Cited

U.S. PATENT DOCUMENTS

| | | |
|---|---|---|
| 2014/0375845 A1 | 12/2014 | Lee et al. |
| 2017/0220838 A1 | 8/2017 | He et al. |
| 2017/0220844 A1 | 8/2017 | Jones et al. |
| 2018/0137337 A1 | 5/2018 | Zeng et al. |
| 2019/0068901 A1 | 2/2019 | Martinello |
| 2020/0143135 A1* | 5/2020 | Kim .................. G06V 40/1347 |
| 2020/0250391 A1* | 8/2020 | Cao .................. G06F 3/041661 |

* cited by examiner

SENSOR DISPLACEMENT COMPENSATION IN AN OPTICAL BIOMETRIC IMAGING ARRANGEMENT UNDER A DISPLAY

CROSS-REFERENCE TO RELATED APPLICATIONS

This application is a 371 U.S. National Stage of International Application No. PCT/SE2020/050658, filed Jun. 24, 2020, which claims priority to Swedish Patent Application No. 1950837-3, filed Jul. 3, 2019. The disclosures of each of the above applications are incorporated herein by reference in their entirety.

FIELD OF THE INVENTION

The present invention relates to method for producing a biometric image using an optical biometric imaging arrangement. The invention also relates to an optical biometric imaging arrangement.

BACKGROUND

Biometric systems are widely used as means for increasing the convenience and security of personal electronic devices, such as mobile phones etc. Fingerprint sensing systems, in particular, are now included in a large proportion of all newly released consumer electronic devices, such as mobile phones.

Optical fingerprint sensors have been known for some time and may be a feasible alternative to e.g. capacitive fingerprint sensors in certain applications. Optical fingerprint sensors may for example be based on the pinhole imaging principle and/or may employ micro-channels, i.e. collimators or microlenses to focus incoming light onto an image sensor.

It has recently been of interest to arrange optical fingerprint sensors under the display of electronic devices. In such arrangements, the display includes holes which allows transmission of light to the sensor. The display therefore causes a masking effect in the image on the sensor.

A captured fingerprint image is typically normalized using pre-captured calibration images for obtaining a final fingerprint image. The calibration images provide for normalizing the pixel values to a white and a black level.

However, for a perfect calibration the spatial match is required between the display masking present when the calibration images are acquired and when the fingerprint image is acquired. The perfect spatial match is difficult to achieve and maintain. For example, if the electronic device is dropped the display may shift its position with respect to the fingerprint sensor.

Accordingly, there is a need for a way to compensated for a displacement between the display and the fingerprint sensor.

SUMMARY

In view of above-mentioned and other drawbacks of the prior art, it is an object of the present invention to provide a method for producing a biometric image based on an illuminance calibration image which is displacement corrected.

According to a first aspect of the invention, there is provided a method for producing a biometric image using an optical biometric imaging arrangement including a set of micro lenses adapted to redirect incoming light onto a photodetector pixel array, the method comprising: capturing a biometric image including a set of sub-images using an optical biometric imaging arrangement; estimating a spatial transformation between the at least one biometric sub-image and corresponding masking calibration sub-images; applying the spatial transformation to retrieved illuminance calibration sub-images adapted for illuminance calibration for captured biometric sub-images, to align the illuminance calibration sub-images with the biometric sub-image; and normalizing the biometric sub-images using the aligned illuminance calibration sub-images for providing a normalized biometric image based on the normalized biometric sub-images.

By means of the invention, the illuminance calibration sub-images may be re-aligned to correct for a misalignment between the display and the photosensor pixel array. Using the inventive method, a displacement between the display and the photodetector pixel array is estimated and corrected for by shifting the illuminance calibration sub-images, such that they can be used for the new position of the display relative the photodetector pixel array.

The inventor realized that the arrangement of the display having through-holes allowing transmission of light onto the below photodetector pixel array causes a masking effect on the pixel array. Thus, it is advantageous to detect the mask structure of the display on the image sensor for improved alignment of the illuminance calibration sub-images.

The present invention is at least partly based on the realization that the displacement of the display, having the through holes that allow transmission of light onto the photodetector pixel array, with respect to the photodetector pixel array can be estimated by evaluating a relationship, such as a spatial transformation, between two subsequent images. Since the illuminance calibration images are typically captured at an early calibration stage, a spatial shift between the display with the transmission holes and the photodetector array may have occurred when subsequent biometric images are acquired. This means that the masking effect caused by the display panel is also displaced. When normalizing the biometric image using the calibration image an error is caused by the displacement. The invention provides for correcting the illuminance calibration images for the displacement.

The masking calibration sub-image is preferably adapted to enhance the effect of the display masking so that the effect of display masking displacement is distinguishable from other irradiance effects on the pixel array. The masking calibration image may advantageously be produced from an illuminance calibration image by enhancing the effect of display masking displacement in the illuminance calibration image.

According to embodiments, estimating the transformation may be performed for each of a set of sub-images of the biometric image in relation to respective ones of a set of sub-images of the masking calibration image, wherein a spatial transformation is applied to the corresponding illuminance calibration sub-images.

According to embodiments, estimating the spatial transformation may be performed for each sub-image of the biometric image in relation to respective sub-images of the masking calibration image, wherein a spatial transformation is applied to each of the illuminance calibration sub-images. Estimating and applying the spatial transforming for each of the sub-images provides for more accurate correction of the illuminance calibration images. For example, in this way may rotational corrections more accurately be captured and applied.

However, in some embodiments may the estimated spatial transformation be a common estimate for all the sub-images of the biometric image. The common estimate may for example be an average spatial transformation in one plane, or in three-dimensions.

The masking calibration image may be based on an illuminance calibration image.

According to embodiments, the method may comprise computing the masking calibration image by the steps of: retrieving an illuminance calibration image including a set of sub-images; computing a mathematical model of the imaging roll-off effect in the illuminance calibration sub-images caused by the microlenses, applying the mathematical model to the sub-images of the illuminance calibration image to at least partly remove the roll-off effect from the illuminance calibration sub-images to produce masking calibration sub-images; and, storing the masking calibration sub-images that have been subject to the mathematical model in a memory.

The irradiance of the pixels may be the product of two effects, the display masking and the roll-off effect related to the microlens shape. Since the microlenses are fixed in relation to the pixel array, the roll-off effect is not associated with a displacement between the display and the pixel array. It is therefore advantageous to separate the roll-off effect from the display masking effect.

The mathematical model may be computed by the steps of: averaging the pixel values from sub-images of the illuminance calibration image, applying curve-fitting to cross-sections of the averaged sub-images, computing the mathematical model as a three-dimensional model of the average imaging roll-off based on the curve-fitting.

According to embodiments, the retrieved masking calibration sub-images may have been subjected to bandpass filtering using a bandpass filter, wherein the method comprises applying the bandpass filter to the biometric sub-images before estimating the spatial transformation using the filtered biometric sub-images and the filtered masking calibration sub-images.

By applying a bandpass filter to illuminance calibration sub-images used for producing the masking calibration image, and the biometric image, a respective zero-mean image may be provided which emphasizes the spatial frequencies that are useful for characterizing the mask structure of the display.

Estimating the spatial transformation may include evaluating a relationship between the biometric sub-images and the masking calibration sub-images.

In embodiments, evaluating the relationship includes: calculating a correlation between sub-images of the biometric image and the sub-images of the masking calibration image to obtain a cross-correlation matrix, wherein the spatial transformation is estimated based on the cross-correlation matrix.

This is one advantageous way of estimating the displacement. Other possibilities include computing cross-section vectors by summing a number of rows or columns in one dimension and then calculate cross correlation vectors for each direction. Another possible implementation is to maximize a computed image quality metric versus a suitable range of displacements using a gradient method or other mathematical optimization method like the Nelder-Mead Simplex Method.

According to embodiments, retrieving a mathematical model of an imaging roll-off effect caused by the microlenses; and applying the mathematical model to the sub-images of the biometric images to at least partly remove the roll-off effect from the biometric sub-images before estimating the spatial transformation.

According to embodiments, the method may comprise: applying the mathematical model to the sub-images of the illuminance calibration images to at least partly remove the roll-off effect from the illuminance calibration images before applying the spatial transformation to the illuminance calibration sub-images.

According to embodiments, the method may comprise subsequent to applying the spatial transformation to the illuminance calibration sub-images, applying an inverse of the mathematical model to the sub-images of the illuminance calibration images to at least partly add the roll-off effect to the aligned illuminance calibration images before normalizing the biometric image.

In embodiments, the method may comprise comparing the estimated spatial transformation to a transformation threshold, wherein the estimated spatial transformation is applied to the illuminance calibration images only when the estimated spatial transformation exceeds the transformation threshold. Thus, If the estimated displacement exceeds a set threshold, then the illuminance calibration images will be adjusted. Otherwise the non-adjusted illuminance calibration images are used for the normalization of the biometric image.

A first illuminance calibration image including a plurality of sub-images is retrieved for a white target and a second illuminance calibration image including a plurality of sub-images is retrieved for a black target.

The spatial transformation may be a horizontal displacement. However, it is also possible to apply the method for a vertical displacement.

In some embodiments is a vertical displacement determined prior to determining a horizontal displacement. In other embodiments is the horizontal displacement and the vertical displacement estimated jointly.

According to a second aspect of the invention, there is provided an optical biometric imaging arrangement configured to be arranged under an at least partially transparent display panel and configured to capture an image of an object located on an opposite side of the at least partially transparent display panel, the optical biometric imaging arrangement comprising: an image sensor comprising a photodetector pixel array; an array of light redirecting elements, wherein each light redirecting element is configured to redirect light onto the photodetector pixel array, wherein the optical biometric imaging arrangement is configured to: capture a biometric image including a set of sub-images; estimate a spatial transformation between the at least one biometric sub-image and corresponding masking calibration sub-images; apply the spatial transformation to retrieved illuminance calibration sub-images adapted for illuminance calibration for captured biometric sub-images to align the illuminance calibration sub-images with the biometric sub-image; and normalize the biometric sub-images using the aligned calibration sub-images for providing a normalized biometric image based on the normalized biometric sub-images.

The at least partly transparent display panel includes openings for allowing transmission of light through the least partly transparent display and towards the image sensor.

Preferably, the array of light redirecting elements is an array of microlenses. Each microlens may be arranged to redirect light onto a subarray of pixels in the photodetector pixel array.

The outer surface of a display panel under which the optical biometric imaging arrangement is arranged may also be referred to as a sensing surface. The operating principle of the described optical biometric imaging arrangement is that light emitted by pixels in the display panel will be reflected by a finger placed on the sensing surface, and the reflected light is received by the light redirecting elements and subsequently redirected onto a corresponding subarray of pixels or a single pixel in the photodetector pixel array. In case of a subarray, an image of a portion of a finger can be captured for each subarray. By combining the images from all the light redirecting elements, an image representing the fingerprint can be formed and subsequent biometric verification can be performed.

The transparent display panel may comprise a color controllable light source. Various types of displays can be used in accordance with embodiments. For example, display panels based on OLED, u-LED with any type of tri-stimulus emission like RGB, CMY or others. Thereby, in-display biometric imaging is enabled.

The microlenses may be arranged in an array having a pitch in the range of 50 µm to 2 mm.

The microlenses may be circular lenses having a diameter in the range of 20 µm to 1 mm.

The microlenses may be rectangular lenses having a length of a shortest side in the range of 20 µm to 1 mm.

Moreover, the microlens may have a height in the range of 2 µm to 600 µm.

With the above described possible configurations of the plurality of microlenses, an optical fingerprint senor for use under a display panel can be provided, and the specific configuration can be adapted based on the properties of the display panel and on the requirements for the application at hand.

Further effects and features of the second aspect of the invention are largely analogous to those described above in connection with the first aspect of the invention.

According to a third aspect of the invention, there is provided an electronic device comprising: a transparent display panel; the optical biometric imaging arrangement according to the second aspect of the invention, and processing circuitry configured to: receive a signal from the optical biometric imaging arrangement indicative of a fingerprint of a finger touching the transparent display panel, perform a fingerprint authentication procedure based on the detected fingerprint.

The electronic device may be e.g. a mobile device such as a mobile phone (e.g. Smart Phone), a tablet, a phablet, etc.

Further effects and features of the third aspect of the invention are largely analogous to those described above in connection with the first aspect and the second aspect of the invention.

There is further provided a computer program product comprising a computer readable medium having stored thereon computer program means for producing a biometric image using an optical biometric imaging arrangement including a set of micro lenses adapted to redirect incoming light onto a photodetector pixel array, wherein the computer program product comprises: code for estimating a spatial transformation between the at least one biometric sub-image and corresponding masking calibration sub-images; code for applying the spatial transformation to retrieved illuminance calibration sub-images adapted for illuminance calibration for captured biometric sub-images to align the illuminance calibration sub-images with the biometric sub-images; and code for normalizing the biometric sub-images using the aligned calibration sub-images for providing a normalized biometric image based on the normalized biometric sub-images.

Further features of, and advantages with, the present invention will become apparent when studying the appended claims and the following description. The skilled person realize that different features of the present invention may be combined to create embodiments other than those described in the following, without departing from the scope of the present invention.

BRIEF DESCRIPTION OF THE DRAWINGS

These and other aspects of the present invention will now be described in more detail, with reference to the appended drawings showing an example embodiment of the invention, wherein.

DETAILED DESCRIPTION OF EXAMPLE EMBODIMENTS

In the present detailed description, various embodiments of the optical biometric imaging arrangement according to the present invention are mainly described with reference to an optical biometric imaging arrangement arranged under a display panel. However, it should be noted that the described imaging arrangement also may be used in other optical biometric imaging applications such as in an optical biometric arrangement located under a cover glass or the like.

Figure 1:
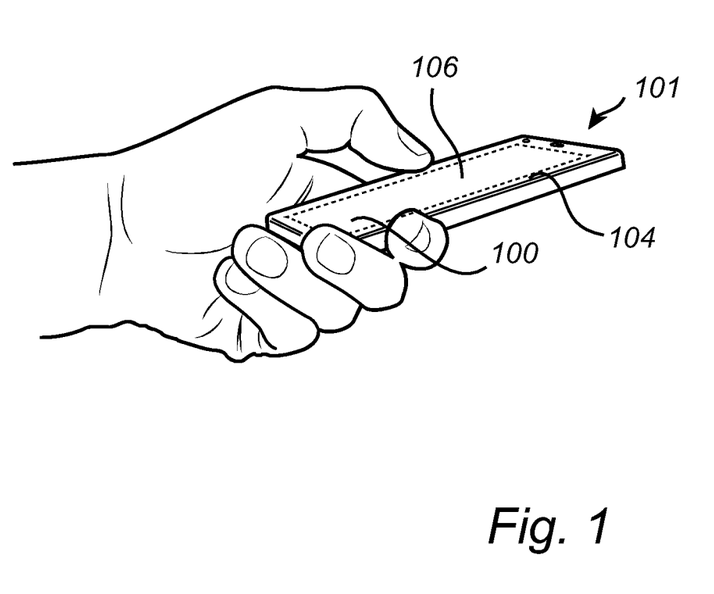
FIG. 1 schematically illustrates an example of an electronic device according to embodiments of the invention.

Turning now to the drawings and in particular to FIG. 1, there is schematically illustrated an example of an electronic device configured to apply the concept according to the present disclosure, in the form of a mobile device 101 with an integrated in-display optical biometric imaging arrangement 100 and a display panel 104 with a touch screen interface 106. The optical biometric imaging arrangement 100 may, for example, be used for unlocking the mobile device 101 and/or for authorizing transactions carried out using the mobile device 101, etc.

The optical biometric imaging arrangement 100 is here shown to be smaller than the display panel 104, but still relatively large, e.g. a large area implementation. In another advantageous implementation the optical biometric imaging arrangement 100 may be the same size as the display panel 104, i.e. a full display solution. Thus, in such case the user may place his/her finger anywhere on the display panel for biometric authentication. The optical biometric imaging arrangement 100 may in other possible implementations be smaller than the depicted optical biometric imaging arrangement, such as providing a hot-zone implementation.

Preferably and as is apparent for the skilled person, the mobile device 101 shown in FIG. 1 further comprises a first antenna for WLAN/Wi-Fi communication, a second antenna for telecommunication communication, a microphone, a speaker, and a phone control unit. Further hardware elements are of course possibly comprised with the mobile device.

It should furthermore be noted that the invention may be applicable in relation to any other type of electronic devices comprising transparent display panels, such as a laptop, a tablet computer, etc.

Figure 2:
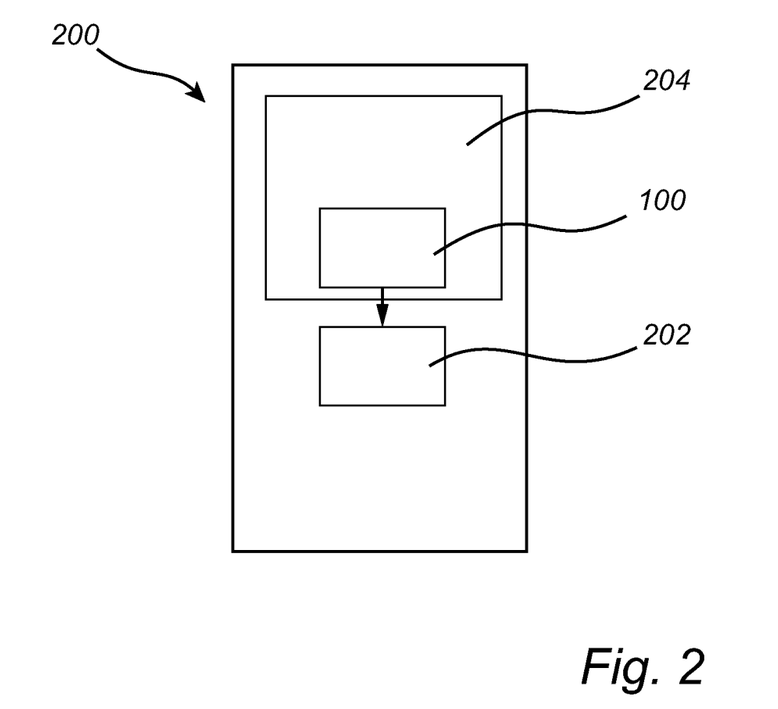
FIG. 2 is a schematic box diagram of an electronic device according to embodiments of the invention.

FIG. 2 is a schematic box diagram of an electronic device according to embodiments of the invention. The electronic device 200 comprises a transparent display panel 204 and an optical biometric imaging arrangement 100 conceptually illustrated to be arranged under the transparent display panel 204 according to embodiments of the invention. Furthermore, the electronic device 200 comprises processing circuitry such as control unit 202. The control unit 202 may be stand-alone control unit of the electronic device 202, e.g. a device controller. Alternatively, the control unit 202 may be comprised in the optical biometric imaging arrangement 100.

The control unit 202 is configured to receive a signal indicative of a detected object from the optical biometric imaging arrangement 100. The received signal may comprise image data.

Based on the received signal the control unit 202 is configured to detect a fingerprint, and based on the detected fingerprint, the control unit 202 is configured to perform a fingerprint authentication procedure. Such fingerprint authentication procedures are considered per se known to the skilled person and will not be described further herein.

Figure 3:
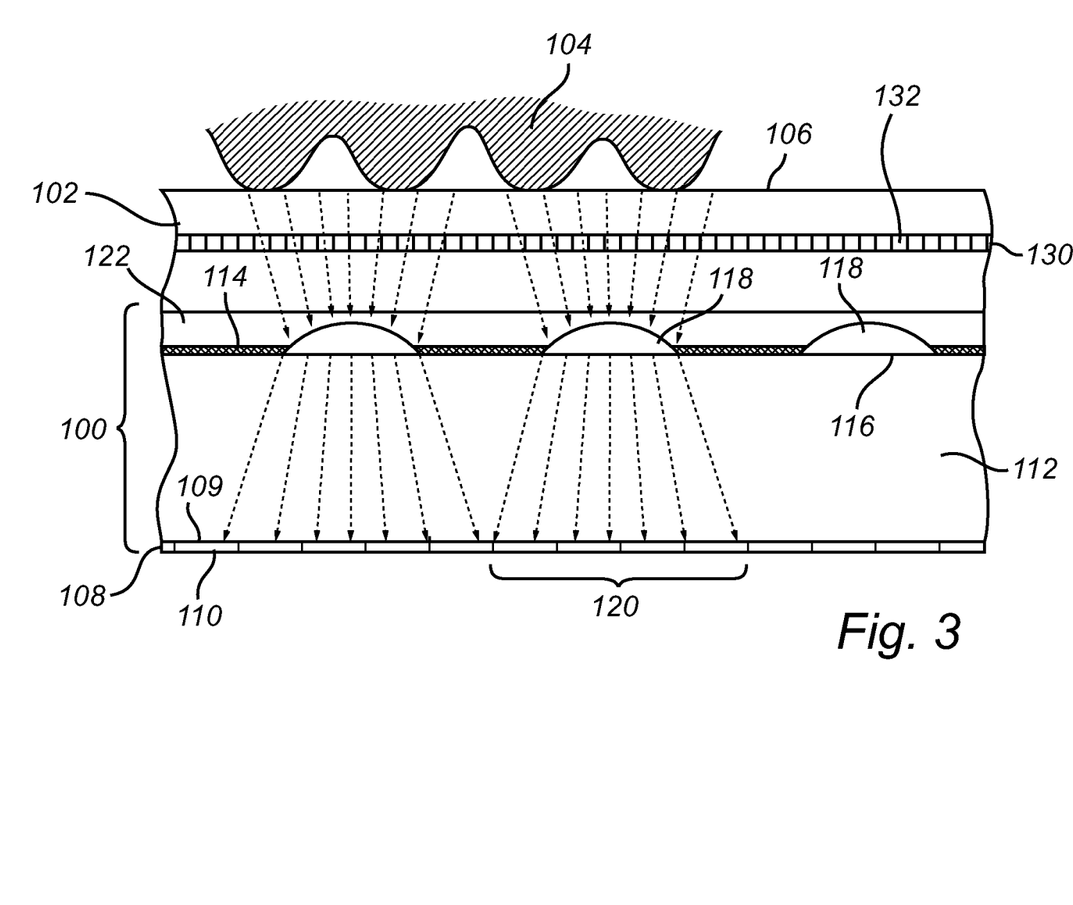
FIG. 3 schematically illustrates an optical biometric imaging arrangement according to an embodiment of the invention.

FIG. 3 schematically illustrates an optical biometric imaging arrangement 100 according to an embodiment of the invention. The optical biometric imaging arrangement 100 is here arranged under an at least partially transparent display panel 102. However, the optical biometric imaging arrangement 100 may be arranged under any cover structure which is sufficiently transparent, as long as the image sensor 108 receives a sufficient amount of light to capture an image of a biometric object in contact with the outer surface of the cover structure, such as a fingerprint or a palmprint. In the following, an optical biometric imaging arrangement 100 configured to capture an image of a finger 104 in contact with an outer surface 106 of the display panel 102 is described.

The optical biometric imaging arrangement 100 comprises an image sensor 108 including a photodetector pixel array 109, where each pixel 110 is an individually controllable photodetector configured to detect an amount of incoming light and to generate an electric signal indicative of the light received by the detector. The image sensor 108 may be any suitable type of image sensor, such as a CMOS or CCD or TFT based sensor connected to associated control circuitry. A thin-film transistor (TFT) based image sensor provides a cost-efficient solution. The operation and control of such an image sensor can be assumed to be known and will not be discussed herein.

The optical biometric imaging arrangement 100 further comprises a transparent substrate 112 arranged to cover the image sensor 108, and an opaque layer 114 covering an upper surface of the transparent substrate 112. The opaque layer 114 further comprises a plurality of separate openings 116 arranged at a distance from each other.

The optical biometric imaging arrangement comprises an array of microlenses 118 each arranged in a respective opening 116 of the optional opaque layer 114 and in the same plane as the opaque layer 114. Moreover, the microlens 118 has the same size and shape as the opening 116 to prevent any stray light which has not passed through the microlens 118, from reaching the image sensor 108.

Each microlens 118 is configured to redirect light through the transparent substrate 112 and onto a subarray 120 of pixels in the photodetector pixel array 109. The subarrays 120 are here defined as arrays of pixels which receive light from only one microlens 118. It should further be noted that the microlenses 118 and pixels are not drawn to scale. The microlens 118 is shown to receive light reflected by the finger 104 which has propagated through the display panel 102 before reaching the microlens 118 and the light received by the microlens 118 is focused onto the image sensor 108. The sub-arrays 120 of pixels receiving light from the microlenses 118 are preferably non-overlapping with adjacent subarrays receiving light from neighboring microlenses.

Moreover, the transparent display panel 102 comprises a color controllable light source 130 comprising individually controllable light emitting pixels 132. For acquiring an image of e.g. a fingerprint or palmprint, the color controllable light source 130 may emit light that is reflected by the finger 104 and detected by the pixels of the image sensor 110.

The optical biometric imaging arrangement 100 further comprises an intermediate layer 122 located between the opaque layer 114 and the display panel 102. The intermediate layer 122 may for example comprise an adhesive layer used to attach the display panel 102 to the imaging device 100, and a refractive index of the intermediate layer 122 may be different from a refractive index of the microlens 118. The intermediate layer comprises an air gap between the transparent display panel and the microlenses 118.

Furthermore, the intermediate layer 122 may also comprise an antireflection coating, an optical filter (e.g. infrared filter) and/or a polarizing filter, which are not illustrated separately herein. It is in general preferable that the refractive index of the microlens 118 is as high as possible and that it is different from the refractive index of any adjacent material above or below the microlens 118.

As will be described in more detail in FIG. 4, there are suitable openings or optical paths past the color controllable light source 130 so that the light beams being transmitted from the finger 104 may reach the image sensor 108.

An acquired biometric image using the optical biometric imaging arrangement 100 is normalized using illuminance calibration images which often have been acquired prior to using the biometric sensor for acquiring biometric images, i.e. an initial factory calibration The illuminance calibration images are acquired for a completely white target and for a completely black target and are used for interpolating the measured pixel values in the acquired biometric image between the two calibrated white and black levels.

However, using the illuminance calibration images for such "irradiance normalization" requires that there is a nearly perfect horizontal match between the display masking present in the illuminance calibration sub-images caused by the holes or openings in the display 102 and the corresponding display masking in the biometric sub-images. If the image sensor moves slightly horizontally or vertically after the initial calibration, e.g. in the factory, then there will no longer be the required alignment and the irradiance normalization will fail.

Figure 4:
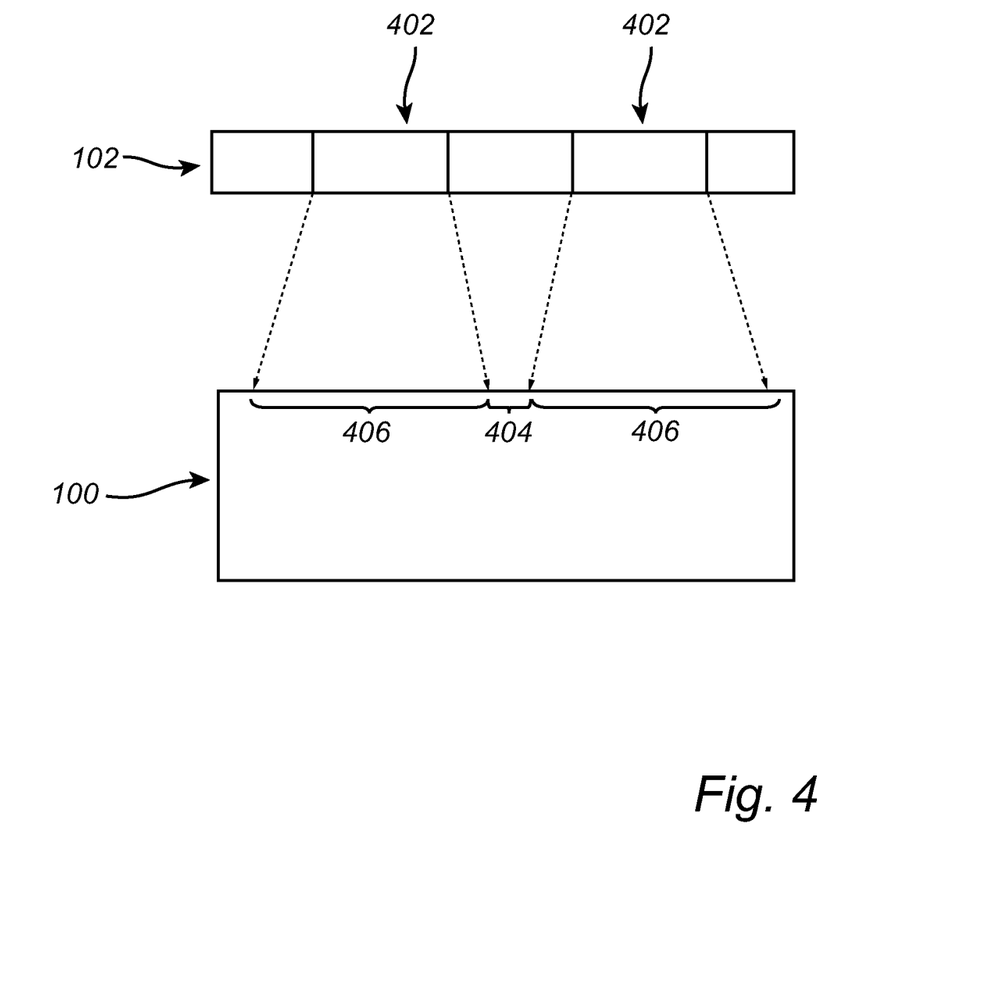
FIG. 4 conceptually illustrates a display panel with openings that allow transmission of light through the display panel and onto an optical biometric imaging arrangement.

FIG. 4 conceptually illustrates a display panel 102 with openings 402 that allow transmission of light through the display panel 102 and onto the optical biometric imaging arrangement 100 provided as described with reference to FIG. 3. The display panel 102 masks portions 404 of the optical biometric imaging arrangement 100 from receiving the same intensity of light as the surrounding portions 406. This display masking effect, i.e. the mask portion 404 will move horizontally if the optical biometric imaging arrangement 100 is displaced horizontally.

If a biometric image is acquired after the display panel 102 was displaced with respect to the optical biometric imaging arrangement 100, then the illuminance calibration image will have its masked portions 404 in a different position than the same masked portion in the biometric image. Thus, the normalization will fail in such case since image portions in the biometric image will no longer correspond to image portions in the illuminance calibration images.

The display masking, i.e. the pattern of the mask portions 404, can typically have a periodicity of around 50-100 microns. A displacement of just ⅒ of this periodicity (i.e. 10 micron) severely affects the quality of the irradiance normalized sub-images and thereby also reduces the quality of the final stitched image used for biometric verification. Methods of the present disclosure alleviates this problem.

Figure 5:
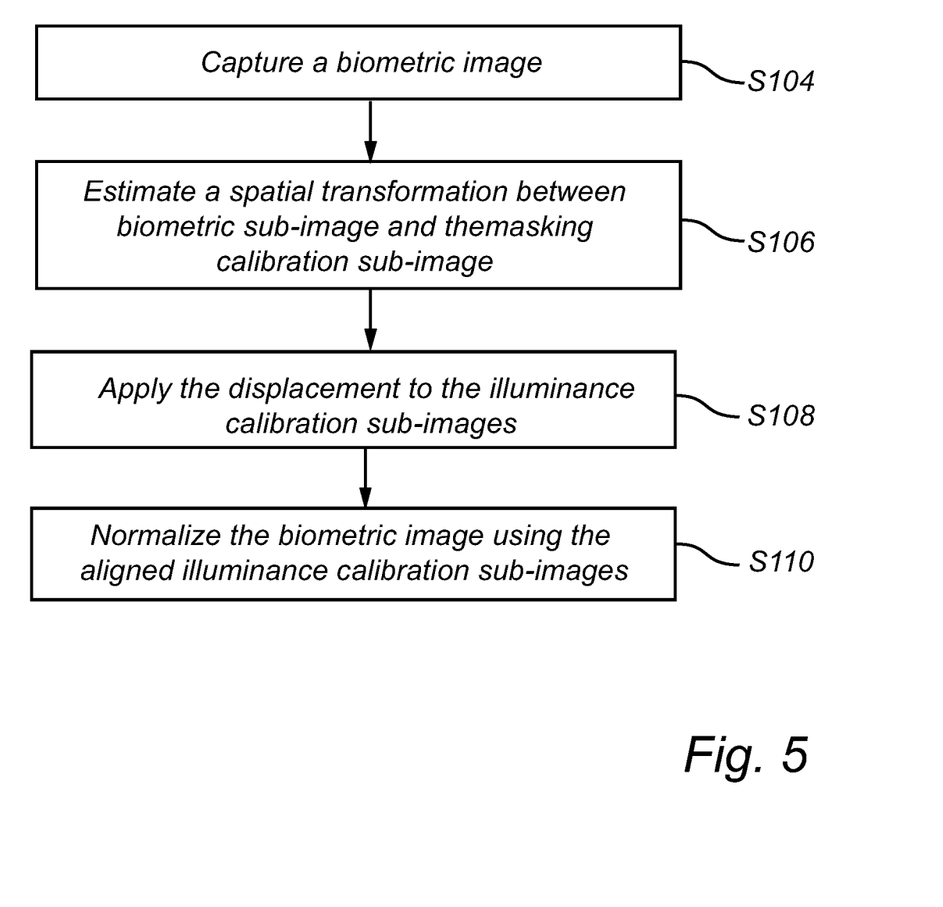
FIG. 5 is a flow-chart of method steps according to embodiments of the invention.

FIG. 5 is a flow-chart of method steps according to embodiments of the invention. In step S104, capturing a biometric image including a set of sub-images using an optical biometric imaging device 100. The masking calibration sub-images may have been prepared as described in FIG. 6. Next, in step S106, a spatial transformation between the at least one biometric sub-image and corresponding masking calibration sub-images is estimated. In step S108, applying the spatial transformation to retrieved illuminance calibration sub-images adapted for illuminance calibration for captured biometric sub-images to align the illuminance calibration sub-images with the biometric sub-images. In step S110, normalizing the biometric sub-images using the aligned calibration sub-images for providing a normalized biometric image based on the normalized biometric sub-images.

The illuminance calibration images may include a first illuminance calibration image including a plurality of sub-images is retrieved for a white target and a second illuminance calibration image including a plurality of sub-images is retrieved for a black target.

The masking calibration image including sub-images may have been produced prior to usage of the optical biometric imaging arrangement and stored in memory. The masking calibration image may originate from an illuminance calibration image and may have been produced by the steps of the flow-chart in FIG. 6.

Figure 6:
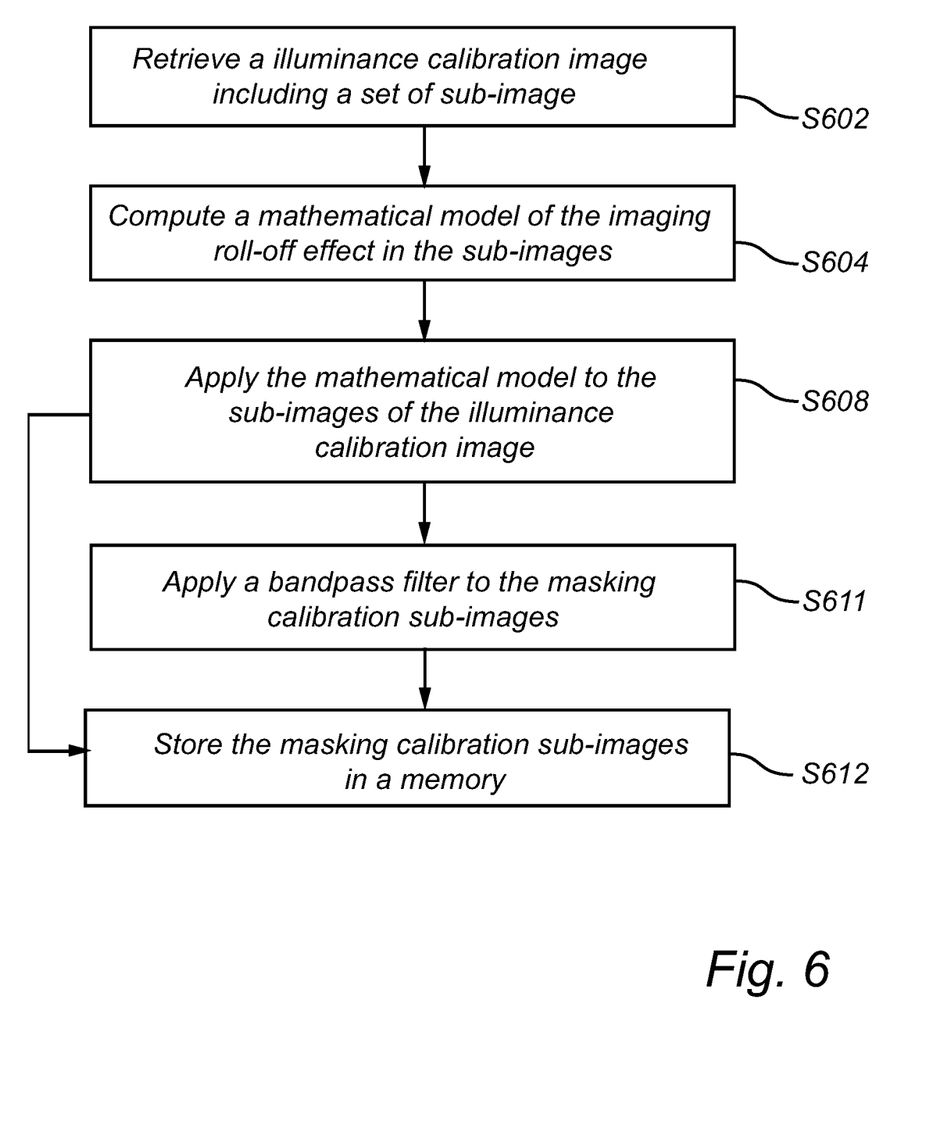
FIG. 6 is a flow-chart of method steps according to embodiments of the invention.

In step S602, retrieving an illuminance calibration image including a set of sub-images. A mathematical model of the imaging roll-off effect in the illuminance calibration sub-images caused by the microlenses is computed in step S604. Applying, in step S608, the mathematical model to the sub-images of the illuminance calibration image to at least partly remove the roll-off effect from the illuminance calibration sub-images. The masking calibration sub-images that have been subject to the mathematical model are stored in a memory in step S612.

Figure 7A:
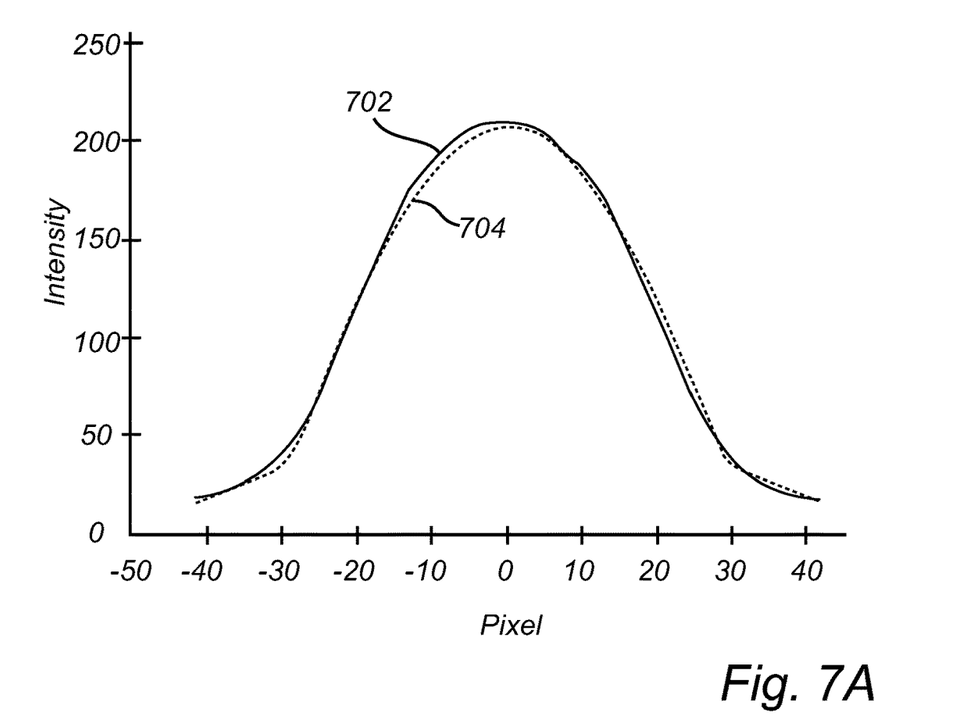
FIG. 7A illustrate cross-sections of roll-off shapes caused by microlenses.
Figure 7B:
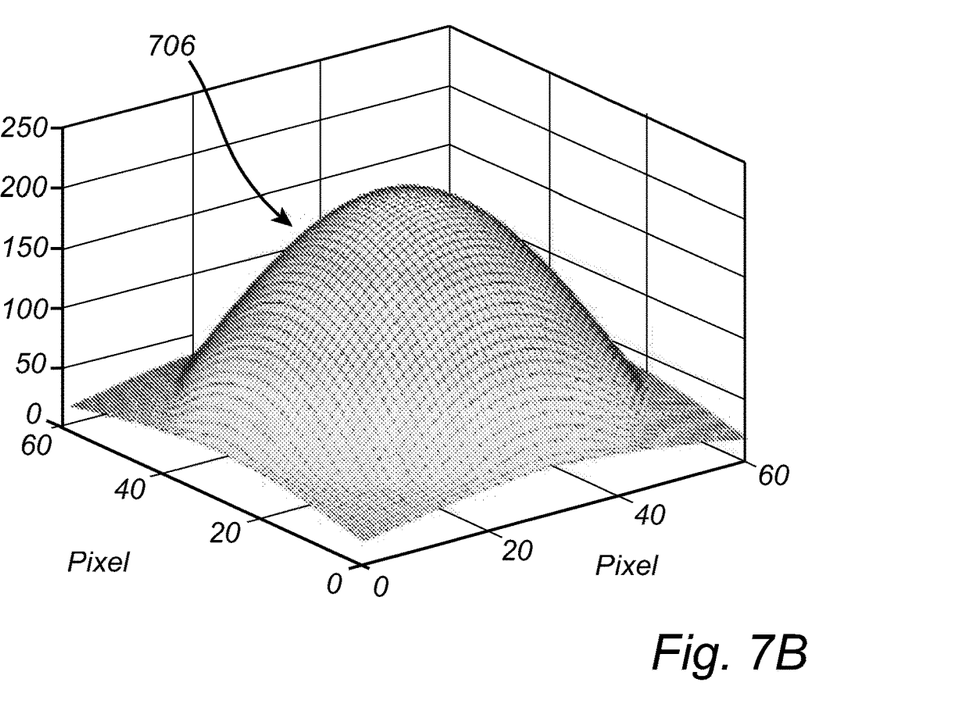
FIG. 7B illustrate an example rotational symmetric estimate model of the roll-off effect in an averaged sub-image.

The mathematical model may be computed by averaging the pixel values from sub-images of an illuminance calibration image. A sub-image is the image produced from the light redirected by a single microlens, in other words, the image produced in the sub-array 120 of pixels receiving light from a single microlens. Applying curve-fitting to cross-sections of the averaged sub-image provides curves of well-defined roll-off shapes as illustrated in FIG. 7A which illustrates two curves 702, 704 of diagonal cross-sections of an averaged sub-image. The mathematical model may subsequently be computed as a three-dimensional model 706 of the average imaging roll-off as illustrated in FIG. 7B, which illustrates an example rotational symmetric estimate model of the roll-off effect in an averaged sub-image.

Applying the mathematical model to a sub-image of the present disclosure may be performed by a division of the sub-image by the three-dimensional model 706, e.g. in a pixel by pixel manner.

Optionally, after the mathematical model 706 has been applied to the sub-images of the illuminance calibration image in step S608, a bandpass filter is applied to the masking calibration sub-images in step S611. The bandpass filter is a two-dimensional bandpass filter. Applying the bandpass filter provides for obtaining a filtered masking calibration sub-images being a zero-mean sub-image that emphasizes the spatial frequencies that are important for characterizing the display panel mask structure. If a bandpass filter is applied, it is the filtered masking calibration sub-images that are stored in step S612 and that is used in the steps of FIG. 5.

The mathematical model 706 may also be applied to the biometric image acquired in step S104 of FIG. 5 to remove the roll-off effect from the biometric image. For this is the mathematical model of an imaging roll-off effect caused by the microlenses retrieved. The mathematical model is applied to the sub-images of the biometric images to at least partly remove the roll-off effect from the biometric images before estimating the spatial transformation.

For example, a fingerprint image acquired in the form of micro-lens sub-images is used for computing a modified fingerprint image. To obtain a fingerprint sub-image in which the roll-off effect has been removed, the estimated micro-lens roll-off is removed from the fingerprint sub-images by division by the 3D roll-off shape 706. Optionally, the same two-dimensional bandpass-filter, as was used for the filtered masking calibration image, is applied to the fingerprint sub-images.

A displacement between the biometric image and the masking calibration image may be estimated using different types of correlation analysis. One possible way is to calculate a correlation between the biometric image and the masking calibration image to obtain a cross-correlation matrix. The horizontal displacement is estimated based on the cross-correlation matrix. A non-limiting example size for the cross-correlation matrix is 20×20 pixels. When one pixel is 3×3 μm and the demagnification to the display panel masking layer is about 2, then the cross-correlation matrix will cover horizontal displacements of +/−120 μm in both X and Y directions. The mathematical model is preferably applied to the sub-images of the biometric images to at least partly remove the roll-off effect from the biometric images before evaluating the correlation, i.e. before calculating the cross-correlation matrix.

Once the cross-correlation matrix is determined, it can be used for estimating the horizontal displacement between the biometric image and the masking calibration image. This estimation may be performed by finding a local maximum in the cross-correlation matrix. In order to improve the estimation of the displacement, an elliptic paraboloid may be fitted to the cross-correlation values in the vicinity of a local maximum index and using the maximum of this function as the final estimate of the cross-correlation peak. The local maximum closest to the center of the matrix (i.e. closest to origo) may be selected.

Figure 8:
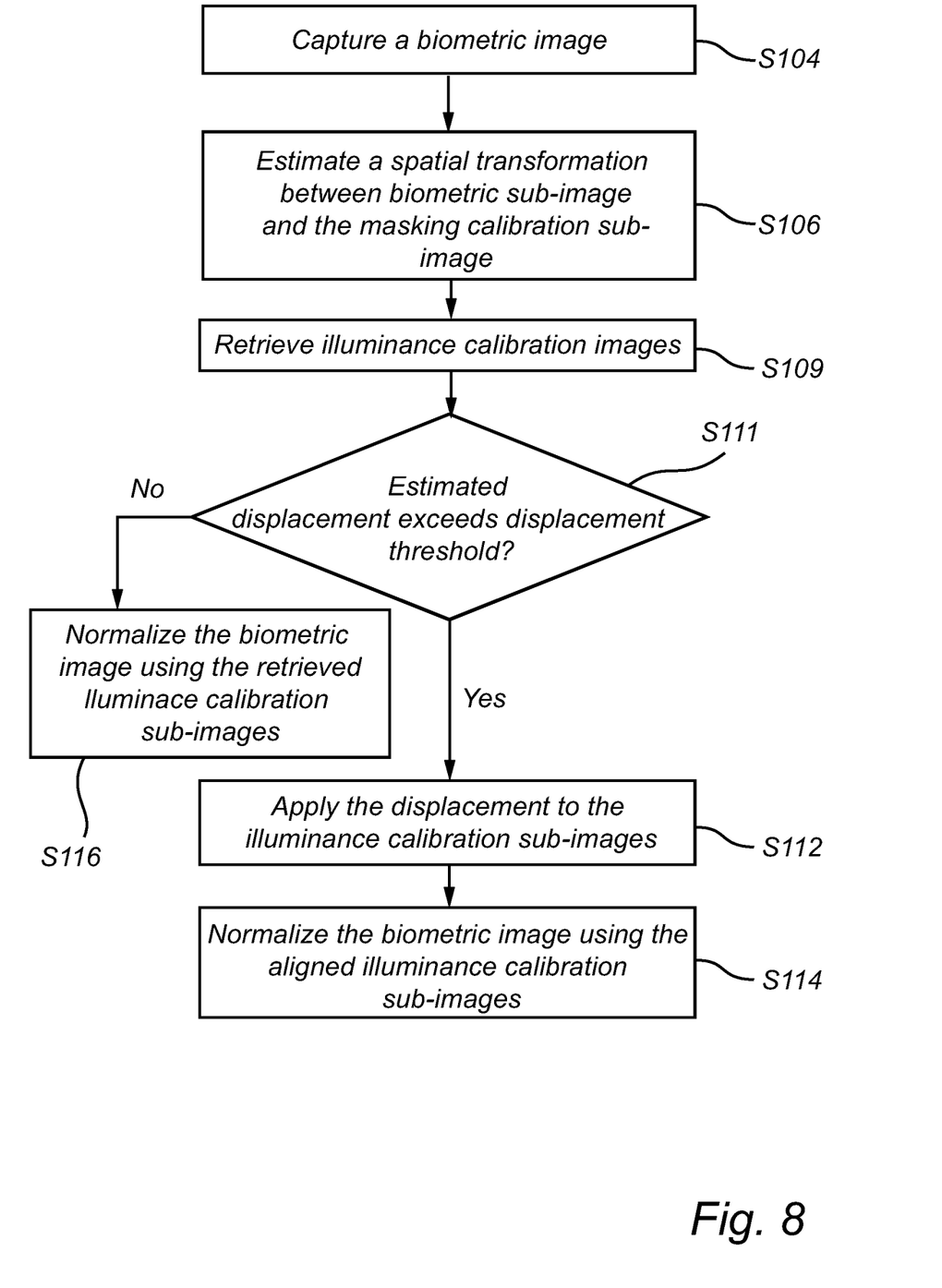
FIG. 8 is a flow-chart of method steps according to embodiments of the invention.

In a preferred embodiment, and as included in the flow-chart of FIG. 8, the estimated displacement is, in step S111, compared to a spatial transformation threshold, wherein the spatial transformation is applied to the illuminance calibration sub-images only when the estimated displacement exceeds the displacement threshold. If the displacement falls below the displacement threshold, the retrieved in step S109, non-modified illuminance calibration images are used for the normalization in step S116. If the displacement exceeds the displacement threshold, the displacement is applied to the sub-images of the illuminance calibration image in step S112, and the aligned illuminance calibration sub-images are used for normalization in step S114.

Figure 9:
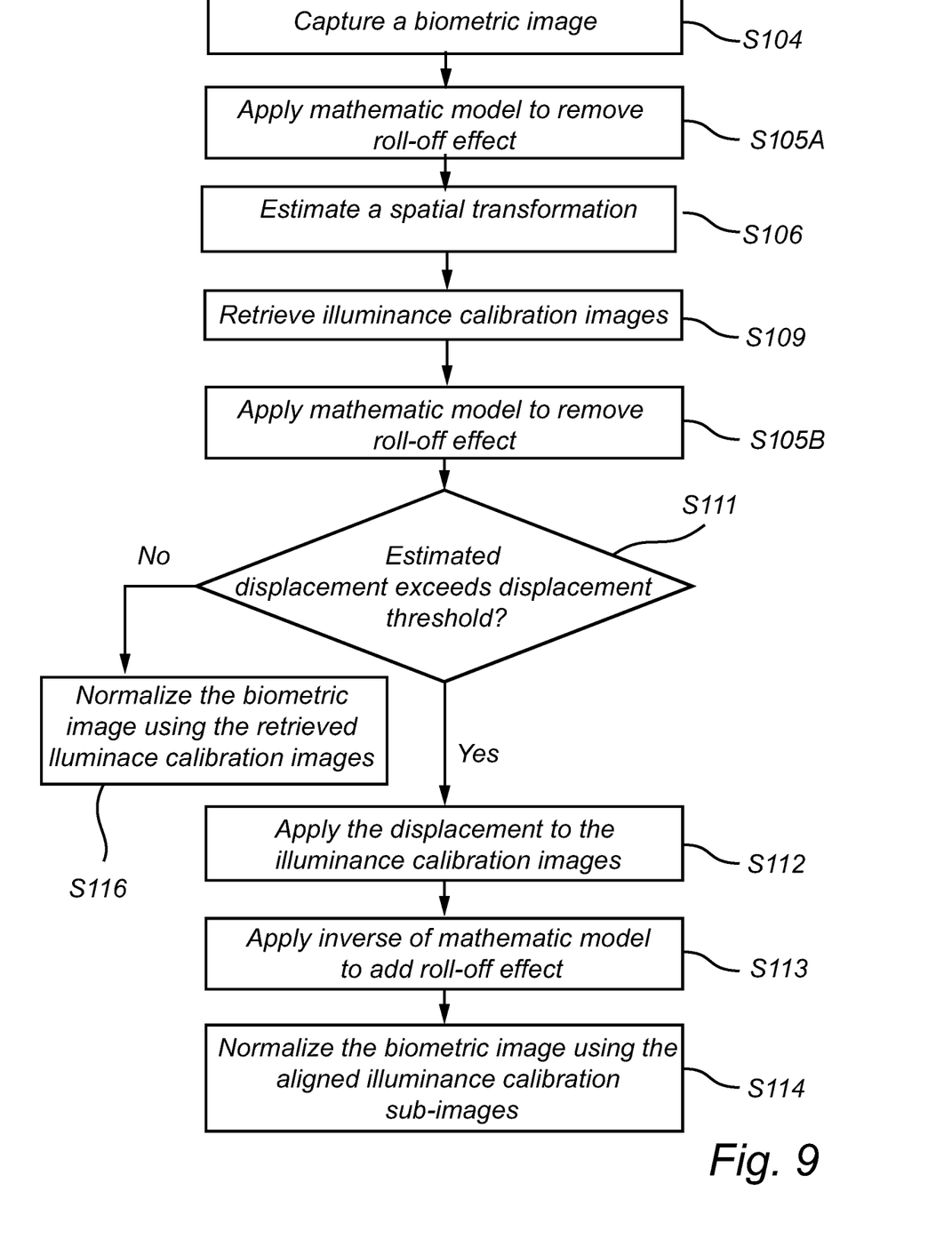
FIG. 9 is a flow-chart of method steps according to embodiments of the invention.

Preferably, and as is illustrated in the flow-chart in FIG. 9, is the mathematical model applied, in step S105A, to the sub-images of the biometric images to at least partly remove the roll-off effect from the biometric images before estimating the spatial transformation in step S106. This provides a more accurate displacement estimation in step S106 since the display masking effect is isolated from the roll-off effect caused by the microlenses.

Further, the mathematical model is preferably applied, in step S105B, to the sub-images of the illuminance calibration images to at least partly remove the roll-off effect from the calibration images before applying the displacement to the illuminance calibration images. In addition, in order to ensure an accurate normalization, is the inverse of the mathematical model applied to the sub-images of the illuminance calibration images, in step S113, to at least partly add the roll-off effect to the aligned illuminance calibration images before normalizing the biometric image in step S114.

The spatial transformation in the above described embodiments is at least a horizontal displacement, in the plane of the display panel and/or the image sensor. In some embodiments, a vertical displacement may be estimated and compensated for prior to compensating for the horizontal displacement as described above.

A spatial transformation may be a joint estimation of scaling and horizontal displacement. Accordingly, the spatial transformation may include a scaling estimation and Z-compensation before the horizontal displacement estimation is performed using the scaling compensated biometric sub-images.

A control unit may include a microprocessor, microcontroller, programmable digital signal processor or another programmable device. The control unit may also, or instead, include an application specific integrated circuit, a programmable gate array or programmable array logic, a programmable logic device, or a digital signal processor. Where the control unit includes a programmable device such as the microprocessor, microcontroller or programmable digital signal processor mentioned above, the processor may further include computer executable code that controls operation of the programmable device. It should be understood that all or some parts of the functionality provided by means of the control unit (or generally discussed as "processing circuitry") may be at least partly integrated with the optical biometric imaging arrangement.

Even though the invention has been described with reference to specific exemplifying embodiments thereof, many different alterations, modifications and the like will become apparent for those skilled in the art. Also, it should be noted that parts of the imaging device and method for manufacturing the imaging device may be omitted, interchanged or arranged in various ways, the imaging device yet being able to perform the functionality of the present invention.

The microlenses are herein illustrated as plano-convex lenses having the flat surface orientated towards the transparent substrate. It is also possible to use other lens configurations and shapes. A plano-convex lens may for example be arranged with the flat surface towards the display panel, and in one embodiment the lens may be attached to a bottom surface of the display panel even though the imaging performance may be degraded compared to the reverse orientation of the microlens. It is also possible to use other types of lenses such as convex lenses. An advantage of using a plano-convex lens is the ease of manufacturing and assembly provided by a lens having a flat surface.

Additionally, variations to the disclosed embodiments can be understood and effected by the skilled person in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage.

The invention claimed is:

1. A method for producing a biometric image using an optical biometric imaging arrangement configured to be arranged under an at least partially transparent display panel and configured to capture an image of an object located on an opposite side of the at least partially transparent display panel, the optical biometric imaging arrangement including a set of microlenses adapted to redirect incoming light onto a photodetector pixel array, the method comprising:
 capturing a biometric image including a set of sub-images using the optical biometric imaging arrangement;
 estimating a spatial transformation between the at least one biometric sub-image and corresponding masking calibration sub-images indicative of a masking effect caused by the display panel
 applying the spatial transformation to retrieved illuminance calibration sub-images adapted for illuminance calibration for captured biometric sub-images to align the illuminance calibration sub-images with the biometric sub-images; and
 normalizing the biometric sub-images using the aligned illuminance calibration sub-images for providing a normalized biometric image based on the normalized biometric sub-images.

2. The method according to claim 1, wherein estimating the transformation is performed for each of a set of sub-images of the biometric image in relation to respective ones of a set of sub-images of the masking calibration image, wherein a spatial transformation is applied to the corresponding illuminance calibration sub-images.

3. The method according to claim 1, wherein estimating the spatial transformation is performed for each sub-image of the biometric image in relation to respective sub-images of the masking calibration image, wherein a spatial transformation is applied to each of the illuminance calibration sub-images.

4. The method according to claim 1, wherein the estimated spatial transformation is a common estimate for all the biometric sub-images.

5. The method according to claim 1, wherein the masking calibration image is based on an illuminance calibration image.

6. The method according to claim 1, comprising computing the masking calibration image by the steps of:
retrieving an illuminance calibration image including a set of sub-images;
computing a mathematical model of the imaging roll-off effect in the illuminance calibration sub-images caused by the microlenses,
applying the mathematical model to the sub-images of the illuminance calibration image to at least partly remove the roll-off effect from the illuminance calibration sub-images to produce masking calibration sub-images; and,
storing the masking calibration sub-images that have been subject to the mathematical model in a memory.

7. The method according to claim 6, wherein the mathematical model is computed by the steps of:
averaging the pixel values from sub-images of the illuminance calibration image,
applying curve-fitting to cross-sections of the averaged sub-image,
computing the mathematical model as a three-dimensional model of the average imaging roll-off based on the curve-fitting.

8. The method according to claim 1, wherein the retrieved masking calibration sub-images were subjected to bandpass filtering using a bandpass filter,
wherein the method comprises applying the bandpass filter to the biometric sub-images before estimating the spatial transformation using the filtered biometric sub-images and the filtered masking calibration sub-images.

9. The method according to claim 1, wherein estimating the spatial transformation includes evaluating a relationship between the biometric sub-images and the masking calibration sub-images.

10. The method according to claim 9, wherein evaluating the relationship includes:
calculating a correlation between sub-images of the biometric image and the sub-images of the masking calibration image to obtain a cross-correlation matrix, wherein the spatial transformation is estimated based on the cross-correlation matrix.

11. The method according to claim 1, comprising:
retrieving a mathematical model of an imaging roll-off effect caused by the microlenses; and
applying the mathematical model to the sub-images of the biometric images to at least partly remove the roll-off effect from the biometric sub-images before estimating the spatial transformation.

12. The method according to claim 11, comprising:
applying the mathematical model to the sub-images of the illuminance calibration images to at least partly remove the roll-off effect from the illuminance calibration sub-images before applying the spatial transformation to the illuminance calibration sub-images.

13. The method according to claim 12, comprising:
subsequent to applying the spatial transformation to the illuminance calibration sub-images, applying an inverse of the mathematical model to the sub-images of the illuminance calibration images to at least partly add the roll-off effect to the aligned illuminance calibration images before normalizing the biometric image.

14. The method according to claim 1, comprising:
comparing the estimated spatial transformation to a transformation threshold, wherein the estimated spatial transformation is applied to the illuminance calibration images only when the estimated spatial transformation exceeds the transformation threshold.

15. The method according to claim 1, wherein a first illuminance calibration image including a plurality of sub-images is retrieved for a white target and a second illuminance calibration image including a plurality of sub-images is retrieved for a black target.

16. The method according to claim 1, comprising determining a vertical displacement prior to determining a horizontal displacement.

17. A control unit configured to perform the steps of claim 1.

18. An optical biometric imaging arrangement configured to be arranged under an at least partially transparent display panel and configured to capture an image of an object located on an opposite side of the at least partially transparent display panel, the optical biometric imaging arrangement comprising:
an image sensor comprising a photodetector pixel array;
an array of light redirecting elements, wherein each light redirecting element is configured to redirect light onto the photodetector pixel array, wherein the optical biometric imaging arrangement is configured to:
capture a biometric image including a set of sub-images;
estimate a spatial transformation between the at least one biometric sub-image and corresponding masking calibration sub-images indicative of a masking effect caused by the display panel;
apply the spatial transformation to retrieved illuminance calibration sub-images adapted for illuminance calibration for captured biometric sub-images to align the illuminance calibration sub-images with the biometric image; and
normalize the biometric sub-images using the aligned illuminance calibration sub-images for providing a normalized biometric image based on the normalized biometric sub-images.

19. An electronic device comprising:
a transparent display panel;
the optical biometric imaging arrangement according to claim 18, and
processing circuitry configured to:
receive a signal from the optical biometric imaging arrangement indicative of a fingerprint of a finger touching the transparent display panel,
perform a fingerprint authentication procedure based on the detected fingerprint.

20. A computer program product comprising a non-transitory computer readable medium having stored thereon computer program means for producing a biometric image using an optical biometric imaging arrangement including a set of micro lenses adapted to redirect incoming light onto a photodetector pixel array, wherein the computer program product comprises:
code for estimating a spatial transformation between the at least one biometric sub-image and corresponding masking calibration sub-images indicative of a masking effect caused by a display panel;
code for applying the spatial transformation to retrieved illuminance calibration sub-images adapted for illuminance calibration for captured biometric sub-images to align the illuminance calibration sub-images with the biometric image; and
code for normalizing the biometric sub-images using the aligned illuminance calibration sub-images for providing a normalized biometric image based on the normalized biometric sub-images.

* * * * *